(12) United States Patent
Mayer

(10) Patent No.: US 8,592,740 B2
(45) Date of Patent: Nov. 26, 2013

(54) ELECTRON MULTIPLICATION IMAGE SENSOR AND CORRESPONDING METHOD

(75) Inventor: Frederic Mayer, Voiron (FR)

(73) Assignee: E2V Semiconductors, Saint-Égrève (FR)

( * ) Notice: Subject to any disclaimer, the term of this patent is extended or adjusted under 35 U.S.C. 154(b) by 344 days.

(21) Appl. No.: 13/159,088

(22) Filed: Jun. 13, 2011

(65) Prior Publication Data

US 2011/0303822 A1 Dec. 15, 2011

(51) Int. Cl.
*H01L 27/00* (2006.01)
*H04N 3/14* (2006.01)

(52) U.S. Cl.
USPC ........................... 250/208.1; 348/311

(58) Field of Classification Search
USPC ........................... 250/208.1; 348/311
See application file for complete search history.

(56) References Cited

U.S. PATENT DOCUMENTS

| | | |
|---|---|---|
| 6,512,544 B1 | 1/2003 | Merrill et al. |
| 7,755,685 B2 * | 7/2010 | Tower et al. ................. 348/294 |
| 2003/0015738 A1 | 1/2003 | Kwon |

FOREIGN PATENT DOCUMENTS

| | | |
|---|---|---|
| EP | 2 023 613 | 2/2009 |
| WO | WO 2009020315 | 2/2009 |

* cited by examiner

*Primary Examiner* — Thanh Luu
(74) *Attorney, Agent, or Firm* — Lowe Hauptman & Ham, LLP

(57) ABSTRACT

The invention relates to image sensors and more particularly those which are intended to capture images at low luminance levels. An active-pixel image sensor is provided, each pixel comprising, on the surface of a semiconductor active layer, a photodiode region adjacent a transfer gate itself adjacent a charge storage region, the transfer gate permitting, when it receives a transfer pulse, the transfer of charge from the photodiode region to the storage region. The photodiode region is adjacent an accelerating gate isolated from the semiconductor active layer. Switching means are provided so as to apply to the accelerating gate, during an integration phase preceding the transfer pulse, a series of high-potential/low-potential alternations inducing an electric field alternately in one direction and in the other direction between the photodiode region and the active layer region located beneath the accelerating gate. Impacts with atoms of the lattice create secondary electrons, thereby increasing the sensitivity of the sensor.

13 Claims, 2 Drawing Sheets

ELECTRON MULTIPLICATION IMAGE SENSOR AND CORRESPONDING METHOD

FIELD OF THE INVENTION

The invention relates to image sensors and more particularly those which are intended to capture images at low luminance levels.

BACKGROUND OF THE INVENTION

When light levels are low, the pixels of a matrix image sensor gather only a small number of electrons and it is necessary to greatly increase the integration period to obtain an image—but this reduces the signal-to-noise ratio.

In charge coupled device (CCD) technology it has already been proposed to incorporate electron multiplication systems into sensors, systems which create additional electrons from the electrons generated naturally by the light. The electrical signal that is then gathered is therefore multiplied by a coefficient. The noise also increases but to a lesser degree than the signal.

This principle of electron multiplication in CCD technology consists in increasing the potential differences present between the charge-transfer gates, thereby accelerating the electrons during transfer. The energy which is given to these electrons is sufficient for impacts with atoms of the semiconductor material to make electrons of these atoms pass from the valence band to the conduction band. These electrons torn from the atoms are themselves accelerated and may cause other impacts. This results in electron multiplication.

In CCD sensors it is possible to do this because the electrons are transferred from gate to gate and it is the increase in the voltage of certain gates which allows the electrons to be greatly accelerated so as to cause this multiplication.

But in active-pixel sensors, comprising within each pixel a charge-voltage conversion circuit (a few transistors), this is not possible because the electron packets are converted into a voltage immediately after each integration period. They are not transferred from gate to gate.

SUMMARY OF THE INVENTION

The invention provides an image sensor which uses active pixels and which, even so, allows a multiplication of electrons with the aim of delivering satisfactory images even when light levels are very low.

According to the invention an active-pixel image sensor is provided, each pixel comprising, on the surface of a semiconductor active layer, a photodiode region adjacent a transfer gate itself adjacent a charge storage region, the transfer gate permitting, when it receives a transfer pulse, the transfer of charge from the photodiode region to the storage region, in which sensor the photodiode region is adjacent an accelerating gate isolated from the semiconductor active layer, and the sensor comprises switching means arranged so as to apply to the accelerating gate, during an integration phase preceding the transfer pulse, a series of high-potential/low-potential alternations inducing an electric field alternately in one direction and in the other to direction between the photodiode region and the active layer region located beneath the accelerating gate.

The electron multiplication takes place during the charge integration and in the photodiode itself in the sense that the electrons (photogenerated or resulting already from the impacts of carriers with atoms) are accelerated in turn from the photodiode towards the accelerating gate and from the accelerating gate towards the photodiode. During these movements, impacts with atoms of the semiconductor layer of the photodiode region or of the region located beneath the accelerating gate make other electrons in the valence band pass into the conduction band. These electrons lose energy during these impacts but they are again accelerated by the electric field that is present.

The number of alternations in potential applied to the accelerating gate defines the overall multiplication coefficient obtained at the end of an integration period T, i.e. between two successive pulses for transferring charge from the photodiode to the charge storage region.

The photodiode is a pinned photodiode, i.e. it has a doped surface region that is kept at a zero reference potential. This region induces, in the photodiode, a fixed base potential (in the absence of photogenerated charges) which depends on the dopant concentrations in the photodiode. The alternation in potential applied to the accelerating gate comprises a high potential which induces, under the gate, a surface potential that is higher than the base potential of the photodiode and a low potential which induces, beneath the gate, a surface potential that is lower than the base potential of the photodiode.

Preferably, the photodiode region completely surrounds the accelerating gate. However, it may also be adjacent an edge of the photodiode.

There may be two (nonadjacent) accelerating gates controlled by alternately high and low potentials. The gates are preferably each completely surrounded by the photodiode region. The two gates are preferably brought to potentials in phase opposition during the series of alternations. There may also be more than two accelerating gates separated from one another by portions of the photodiode region.

The transfer gate between the photodiode region and the storage region is, similarly to the accelerating gate, isolated from the semiconductor active layer by an isolating layer. Preferably the thickness of the isolating layer beneath the accelerating gate is larger than the thickness of the isolating layer beneath the transfer gate, so that a higher potential may be applied to the accelerating gate than to the transfer gate.

BRIEF DESCRIPTION OF DRAWINGS

Other features and advantages of the invention will become clear on reading the detailed description that follows and which is given with reference to the appended drawings in which.

DESCRIPTION OF PREFERRED EMBODIMENTS

Figure 1:
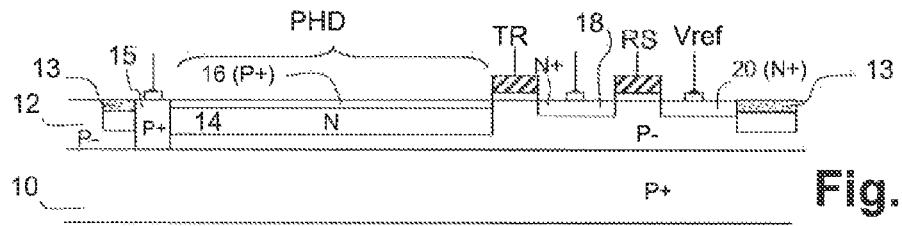
FIG. 1 shows, in vertical cross section, the general structure of an active-pixel image sensor.

In FIG. 1 the main elements of a conventional CMOS technology active pixel are shown. The pixel is formed in a substrate 10 which preferably comprises a lightly p-type doped semiconductor active layer 12 (the symbol p⁻ is used to denote this light doping) formed on the surface of a more heavily doped (p⁺) layer. The pixel is isolated from neighboring pixels by an isolating barrier 13 which completely surrounds the pixel. This barrier may be a shallow isolating trench above a p-type well.

The pixel comprises a photodiode region PHD which is demarcated by an n-type semiconductor region implanted in some of the depth of the active layer 12. This implanted region is surmounted by a p⁺-type surface region 16, which is kept at a zero reference potential. The zero reference potential is that which is applied to the p⁻ active layer. In the simplest case, it is the potential of the p⁺-type substrate, located beneath the active layer, which applies its own potential to the active layer. The surface region 16 is kept at this zero potential for example because the region 16 touches a deep p⁺-type diffusion 15 which joins with the substrate 10. An electrical contact may also be provided on this diffusion 15 so as to apply, via this contact, a zero potential to the region 16.

A charge storage region 18 is provided outside of the photodiode region PHD and is separated therefrom by an isolated gate TR which makes it possible to permit or prevent transfer of charge stored in the photodiode to the storage region. The charge storage region 18 is an n-type diffusion in the active layer 12. A contact is formed on the storage region, so as to make it possible to apply the potential of this region to the gate of a source follower (not shown), so as to convert the charge packet contained in the storage region into a voltage.

Another gate RS, called the reset gate, makes it possible to empty the charge in the storage region into a discharge drain 20 which is an n⁺-type region connected to a positive reset potential Vref.

The pixel in general operates in the following way: illumination of the photodiode region PHD during an integration period T generates electrical charge (electrons in the present case but holes could also be generated if all the conductivity types, and the signs of the applied potential differences, were reversed). This charge is stored in the n-type region of the photodiode. Before the end of the period T, the potential of the storage region is reset to Vref by the reset gate RS. At the end of the period T, a transfer pulse is applied to the gate TR and the charge stored in the photodiode is transferred to the storage region. This charge is then read by the source follower (not shown), while a new integration period begins.

According to the invention, means are provided for moving the electrons stored in the photodiode to a region of the active layer located beneath an accelerating gate and for accelerating them in an inverse direction in this region towards the photodiode during the integration time by alternately switching multiple times the potential applied to the accelerating gate.

Figure 2:
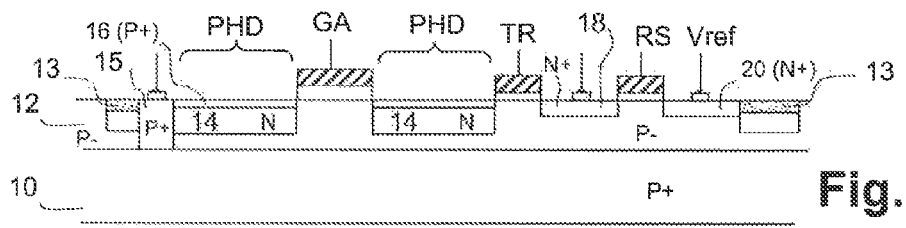
FIG. 2 shows, in vertical cross section, the structure of a pixel modified according to the invention.

If the pixel structure shown in FIG. 2 is used as a starting point (even though other structures could be used as starting points) an accelerating gate GA is provided adjacent the photodiode region. The gate GA is preferably completely surrounded by the photodiode region PHD, but it could also be adjacent one edge of the latter.

The gate GA is isolated from the p-type semiconductor active layer 12 by an isolating layer, in principle made of silicon oxide. This isolating layer is preferably thicker than the isolating layer which separates the transfer gate TR from the active layer. This is because, for the transfer gate TR, it is important for the isolating layer to be very thin so as to ensure a transfer that is as efficient as possible, but, for the accelerating gate, a thicker isolating layer makes it possible to apply accelerating voltages that are higher than the voltages applied to the transfer gate. Isolating layers having the same thickness are however possible.

Figure 4:
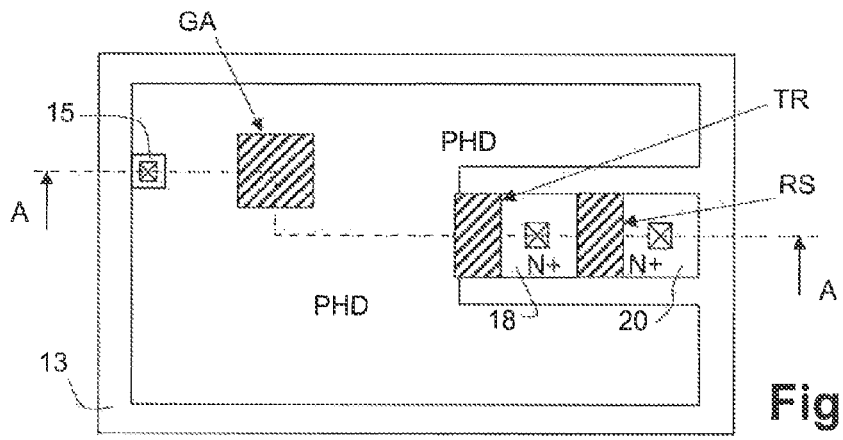
FIG. 4 shows a top view of an exemplary arrangement of the elements of the pixel in FIG. 2.

FIG. 4 shows a top view of a possible arrangement of the elements of the pixel. FIG. 2 is a cross section along the line A-A in FIG. 4. For the sake of simplicity, elements have not been shown that may conventionally be present in the pixel and notably a source follower for copying the potential of the storage region 18, and a row-selection transistor, in the case of a matrix of several rows of pixels, allowing the source of the source follower to be connected to a conducting column of the matrix. These elements are in any case located outside of the isolating region 13 that surrounds the photodiode.

Just as the transfer gate is immediately adjacent the photodiode region, without interposition of an isolating region 13, the accelerating gate is also immediately adjacent the photodiode. Thus charge may flow between the n-type region of the photodiode and the p⁻-type region located beneath the accelerating gate, depending on the respective potentials of these two regions.

Means for switching potential are provided so as to apply directly to the accelerating gate GA a series of high-potential/low-potential alternations. These switching means are not shown because they are not located in the pixel. If the sensor comprises a pixel matrix, these switching means are common to the entire matrix and the accelerating gates GA of all the pixels may all be connected to these switching means. The series of alternations is applied during the integration period T which separates two successive charge transfers (via the transfer gate) between the photodiode region PHD and the storage region 18.

Figure 3:
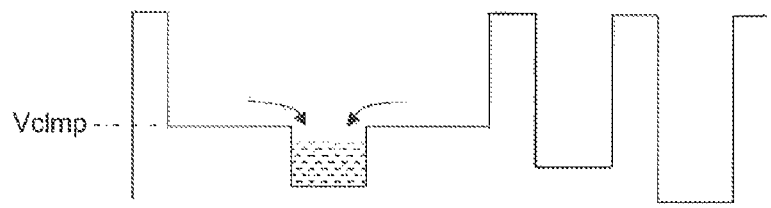
FIG. 3 shows a diagram of the potentials that appear in succession during two alternate switchings of the accelerating gate.
Figure 3:
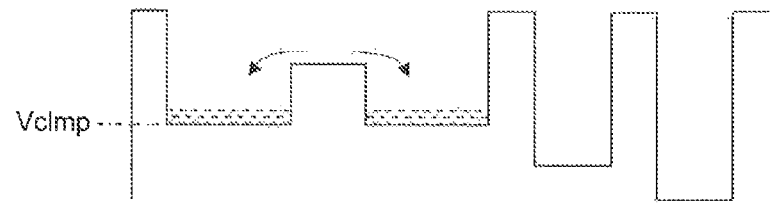

FIG. 3 shows schematic diagrams of the potentials present in the semiconductor during the series of alternations. In accordance with the convention relating to diagrams of potential when the charges considered are electrons, positive potentials increase towards the bottom of the figure.

During the integration period T there is a series of alternations of two different phases resulting from alternate application of a high potential and of a low potential to the accelerating gate. The top diagram in FIG. 4 shows the first phase and the bottom diagram in FIG. 4 shows the second phase. It is possible for many alternations to be made during an integration period T, for example several hundred or several thousand alternations. Before the end of the integration period, the alternating potential is stopped, the gate is kept at the low potential (so that there are no longer any electrons under the accelerating gate) and the transfer pulse is applied to the transfer gate so as to empty the charges contained in the photodiode into the storage region 18. This pulse defines the end of the current integration period and the start of a new integration period, once the potential of the transfer gate has increased again. After the end of the transfer pulse the potential applied to the accelerating gate may be alternated once more; however, it is not absolutely necessary to start immediately after the end of the transfer pulse.

The potential of the p⁺-type surface region 16 of the photodiode is kept at zero because this region is connected to the potential of the substrate. This results in the photodiode region having a reference potential Vclmp, in the absence of charge generated by the illumination.

First alternation: the high potential applied to the accelerating gate GA creates a potential well adjacent the photodiode region and the charge generated by the illumination flows from the photodiode region towards this well. Secondary electrons are created by impacts with atoms of the lattice during this transfer, in an amount proportional to the accelerating energy given to the electrons and therefore all the larger, the higher the potential of the accelerating gate is. During the integration period the transfer gate TR is at a low potential creating a potential barrier so that the electrons generated by the illumination, or the secondary electrons, are confined in the photodiode region and in the region located beneath the accelerating gate.

Second alternation: the accelerating gate is brought to a low potential. The bottom of the potential well present in the region located beneath the gate rises up above the level of the potential in the n-type region of the photodiode. The charge which was present under the gate GA falls into the n-type region of the photodiode. The charge remains confined to this region because of the barriers formed by the isolating region 13 and the transfer gate TR which has a low potential.

Thus the charge generated in the photodiode is moved back and forth with each alternation in the potential applied to the accelerating gate. The acceleration of the electrons in each movement creates secondary electrons. Whence an electron multiplication effect and therefore an increase in the sensitivity of the pixel.

It is possible to make provision for alternation in potential to be triggered only in the event of very low illumination. For example, depending on the illumination level detected, the series of alternations in potential is triggered or is not triggered. If it is not triggered, the accelerating gate is left at the low level. And if it is triggered, it is possible for the number of alternations to be varied as a function of the light level detected.

It should be noted that it is possible to make provision for the application of a negative voltage pulse to the accelerating gate at the end of the integration time, in order to free electrons that might have been trapped in the isolating layer beneath the gate during the alternations. Such a negative pulse could even be applied at the end of each alternation.

The p$^-$-type semiconductor region 12 located beneath the accelerating gate GA is light-sensitive similarly to the photodiode region, although it is less sensitive in the blue because of the presence of the gate which screens the light. The carriers photogenerated beneath the gate are stored under the gate or propelled into the photodiode region, depending on the potential of the gate. For this reason, the presence of the gate has practically no effect on the useful light-sensitive area of the pixel and therefore its sensitivity, even if the gate is not part of the photodiode. In addition, if the technology used is a sensor technology employing a thinned, backlit silicon substrate, there is no longer even a sensitivity reduction in the blue since the gate no longer screens the light.

It should also be noted that the application of a relatively high voltage to the accelerating gate tends to increase the space charge region (region depleted of carriers) beneath the n-type region of the photodiode, thereby increasing the sensitivity in the red and preventing recombination of carriers at depth in the p$^-$-type region, i.e. far from the n-type region.

Figure 5:
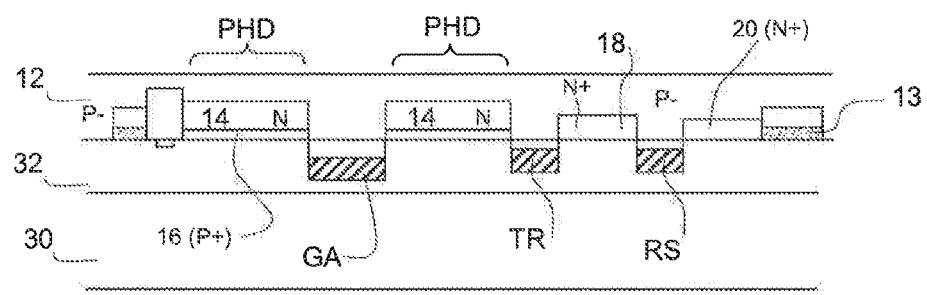
FIG. 5 shows, in vertical cross section, a pixel of a sensor according to the invention formed on a backlit thinned substrate.

FIG. 5 shows a vertical cross section through a pixel analogous to that in FIG. 2 but formed on a thinned backlit substrate. In thinning techniques, various elements of the sensor are fabricated in the active layer 12 via the front side of the substrate which bears the active layer, then this front side is attached to another substrate 30 and the back side is thinned until the active layer 12 is a few microns in thickness. An isolating planarization layer 32 is interposed between the front side of the active layer 12 and the attached substrate 30.

In the preceding embodiment an accelerating gate was provided adjacent the photodiode region, but it is also possible to provide two accelerating gates, separated from each other, or even more than two gates.

Figure 6:
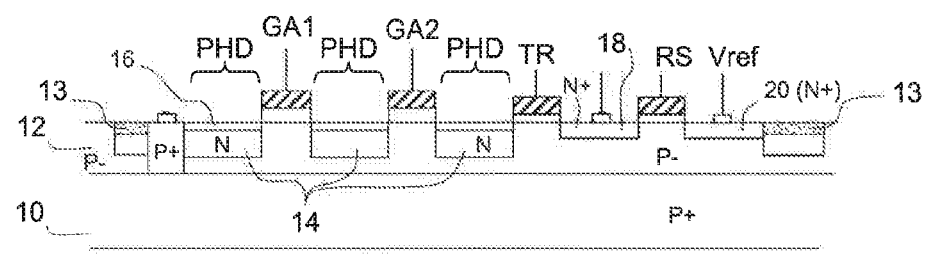
FIG. 6 shows a top view of a modified pixel having two accelerating gates operating in alternation.

FIG. 6 shows a configuration with two gates. The two gates preferably operate in phase opposition so as to strengthen the acceleration effect. However, at the end of the series of alternations, before the transfer pulse is emitted, provision is made for the two gates to be placed at the low-potential level.

Preferably, each of the accelerating gates is entirely surrounded by the photodiode region, but in certain cases it may be preferable for the gates to be placed on an edge of the photodiode region. For example, in large pixels, it may be preferable to place the gates in the four corners of the photodiode region, with the aim of better repulsing the electrons during the charge transfer to the storage region. Since the gates are at the low potential at the moment of the transfer, they help repulse the electrons and prevent pockets of potential forming in the corners.

The invention claimed is:

1. An active-pixel image sensor, each pixel comprising, on the surface of a semiconductor active layer, a photodiode region adjacent a transfer gate itself adjacent a charge storage region, the transfer gate permitting, when it receives a transfer pulse, the transfer of charge from the photodiode region to the storage region, wherein the photodiode region is adjacent an accelerating gate isolated from the semiconductor active layer, and the sensor comprises switching means arranged so as to apply to the accelerating gate, during an integration phase preceding the transfer pulse, a series of high-potential/low-potential alternations inducing an electric field alternately in one direction and in the other direction between the photodiode region and the active layer region located beneath the accelerating gate.

2. The image sensor as claimed in claim 1, wherein the photodiode region comprises a region of a first conductivity type covered by a surface region of the opposite type kept at a zero reference potential, and wherein the high potential of the alternation is higher than the zero reference potential and the low potential is lower than the zero reference potential.

3. The image sensor as claimed in claim 1, wherein the photodiode region completely surrounds the accelerating gate.

4. The image sensor as claimed in claim 2, wherein the photodiode region completely surrounds the accelerating gate.

5. The image sensor as claimed in claim 1, wherein the accelerating gate is placed in a corner of the photodiode region.

6. The image sensor as claimed in claim 2, wherein the accelerating gate is placed in a corner of the photodiode region.

7. The image sensor as claimed in claim 1, wherein it comprises at least one other accelerating gate nonadjacent the first, controlled in alternation by a high potential and a low potential.

8. The image sensor as claimed in claim 7, wherein the two accelerating gates are controlled in phase opposition during the series of alternations.

9. The image sensor as claimed in claim 7, wherein the accelerating gates are each completely surrounded by the photodiode region.

10. The image sensor as claimed in claim 7, wherein the accelerating gates are each placed in a corner of the photodiode region.

11. The image sensor as claimed in claim 7, wherein it comprises more than two accelerating gates separated from one another by portions of the photodiode region.

12. The image sensor as claimed in claim 1, wherein the transfer gate between the photodiode region and the storage region is isolated from the semiconductor active layer by a first isolating layer, and the accelerating gate is isolated from the semiconductor active layer by a second isolating layer, the thickness of the second isolating layer being larger than that of the first isolating layer.

13. A method for sensing an image using an active-pixel image sensor, each pixel comprising, on the surface of a semiconductor active layer, a photodiode region adjacent a transfer gate itself adjacent a charge storage region, the transfer gate permitting, when it receives a transfer pulse, the transfer of charge from the photodiode region to the storage region, method wherein the photodiode region is adjacent an accelerating gate isolated from the semiconductor active layer, and wherein this accelerating gate receives, during a charge-integration phase preceding the transfer pulse, a series of high-potential/low-potential alternations inducing an electric field alternately in one direction and in the other direction between the photodiode region and the active layer region located beneath the accelerating gate, this electric field causing electron multiplication during the charge-integration period.

* * * * *